Dec. 18, 1956 F. J. SKWAREK 2,774,243

TUNING MECHANISM FOR RADIO RECEIVERS

Filed Feb. 1, 1955 5 Sheets-Sheet 1

INVENTOR.
FRANK J. SKWAREK
BY Darby & Darby
ATTORNEYS

Dec. 18, 1956 F. J. SKWAREK 2,774,243

TUNING MECHANISM FOR RADIO RECEIVERS

Filed Feb. 1, 1955 5 Sheets-Sheet 2

INVENTOR.
FRANK J. SKWAREK
BY Darby + Darby
ATTORNEYS

Dec. 18, 1956 F. J. SKWAREK 2,774,243

TUNING MECHANISM FOR RADIO RECEIVERS

Filed Feb. 1, 1955 5 Sheets-Sheet 3

INVENTOR.
FRANK J. SKWAREK
BY Darby & Darby
ATTORNEYS

Dec. 18, 1956 F. J. SKWAREK 2,774,243

TUNING MECHANISM FOR RADIO RECEIVERS

Filed Feb. 1, 1955 5 Sheets-Sheet 4

INVENTOR.
FRANK J. SKWAREK
BY Darby & Darby
ATTORNEYS

TUNING MECHANISM FOR RADIO RECEIVERS

Filed Feb. 1, 1955 5 Sheets-Sheet 5

INVENTOR.
FRANK J. SKWAREK
BY Darby & Darby
ATTORNEYS 2,774,243

TUNING MECHANISM FOR RADIO RECEIVERS

Frank J. Skwarek, Westbury, N. Y., assignor to Polarad Electronics Corporation, Brooklyn, N. Y., a corporation of New York Application February 1, 1955, Serial No. 485,515

15 Claims. (Cl. 74—10.6)

The present invention relates to tuning mechanisms for radio receivers and more particularly to such a mechanism for use in determining the frequency, magnitude and nature of a received radio signal. An unknown radio frequency signal is fed through a multiple stage preselector to a narrow band-pass filter and from thence to a mixer in which the unknown signal is heterodyned with a radio frequency signal of known frequency which has been generated by a local oscillator. The beat signal is then amplified and detected and indicates the magnitude of frequency and other characteristics of the unknown signal.

This application covers only the mechanism for tuning the multiple stage preselector, the remaining elements of the receiver being the subject of a separate application for patent by the same inventor.

The tuning mechanism of the preselector comprises a shaft driving the tuning elements through the medium of a coarse cam and several correction cams which separately adjust the individual stages of the preselector. This arrangement is provided because it is necessary that each stage of the preselector be independently and simultaneously tuned to match the actual characteristics of the oscillator. Since the average characteristics of the oscillator and preselector stages are sufficiently known an initial or coarse cam for adjusting the preselector can function to approximately tune the device. To obtain optimum performance it is essential that each stage of the preselector be adjusted by a fine correction cam which has many adjustment points and which superimposes an individual corrective effect on the common tuning of the preselector stages by the coarse cam.

It is an object of the invention to provide an accurate radio frequency receiver for determining the frequency, amplitude and other characteristics of an unknown radio frequency signal.

It is another object of the invention to provide such a receiver having a multiple stage preselector, the stages of which are jointly tuned to an approximation of the required frequency and are then individually and simultaneously tuned to an exact frequency.

It is another object of the invention to provide a means for effectuating such tuning which includes a shaft driving a coarse cam for simultaneously producing movement of the preselector tuning elements to a position such that the device is tuned to an approximate frequency and individual correction cams arranged to operate simultaneously with the coarse cam and to position the tuning elements in accordance with the exact frequency received.

It is another object of the invention to provide such a preselector tuning mechanism which is accurate and which is at the same time relatively simple in construction and therefore economically manufactured.

Other objects and features of the invention will be apparent when the following description is considered in connection with the annexed drawings, in which, Figure 1 is a perspective view of the tuning device of the present invention;

Figure 1:
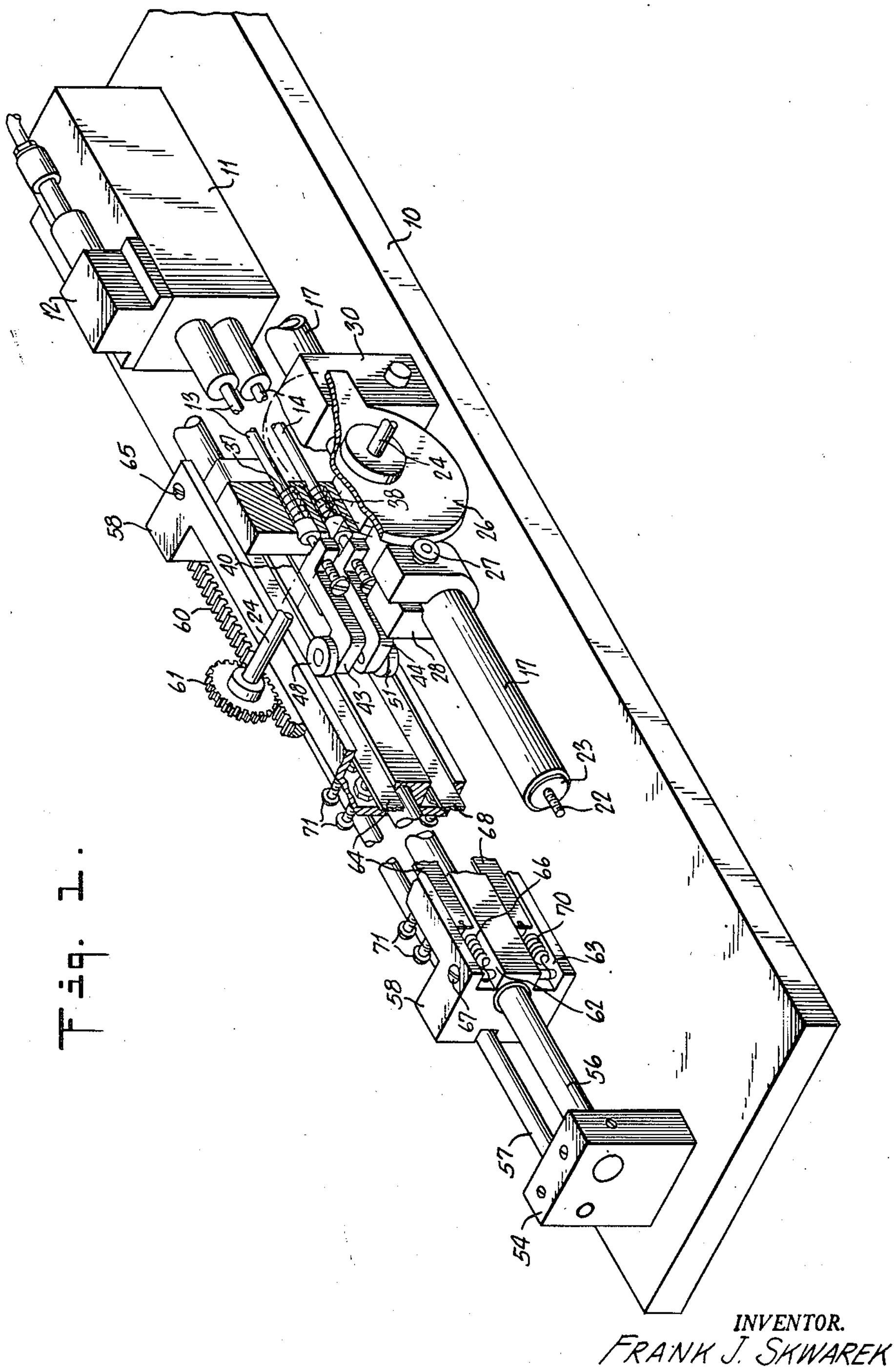

Referring now to the drawings, and particularly to Figure 1 thereof, there is shown therein a base 10 on which there is mounted a preselector 11 and mixer 12. The preselector 11 includes resonant cavities associated with each stage thereof, each of the resonant cavities being adjustable by means of a plunger operating therein. In the present instance two preselector stages are utilized and the two plungers cooperating with the resonant cavities thereof are indicated at 13 and 14.

Figure 6:
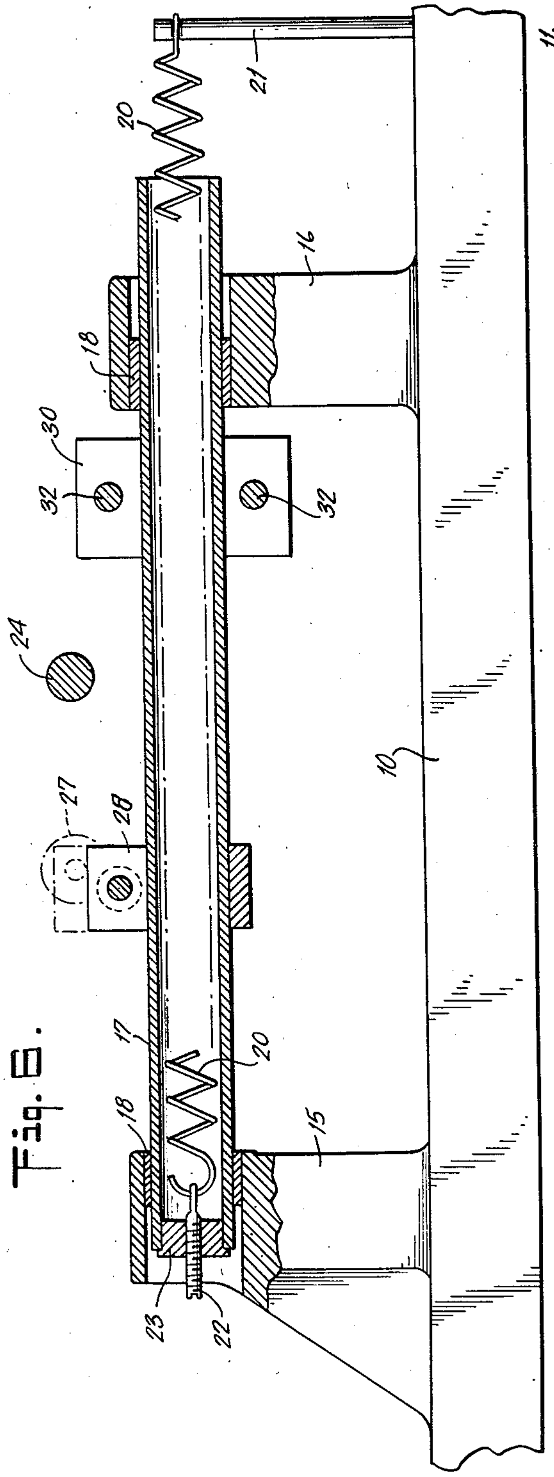
Figure 6 is a vertical cross-section, the view being taken on the plane of the line 6—6 of Figure 2.

Supported from the base 10 by means of the brackets 15 and 16 is a tube 17 which slides in bushings 18 in the brackets mentioned (Figure 6). The tube 17 has a spring 20 extending therethrough the spring being anchored at one end to a rod 21 fixed in the base 10 and held under tension by means of a screw 22 threadedly mounted in a plug 23 at the opposite end. As will be seen, the tube 17 is thus constantly urged to the right as seen in Figures 1 and 6.

Extending at right angles to the tube 17 and lying above it is the main operating shaft 24 which shaft, in addition to performing the functions about to be described, carries devices for operating the local oscillator, this portion of the complete apparatus, however, being described in detail in the application above mentioned.

Figure 3:
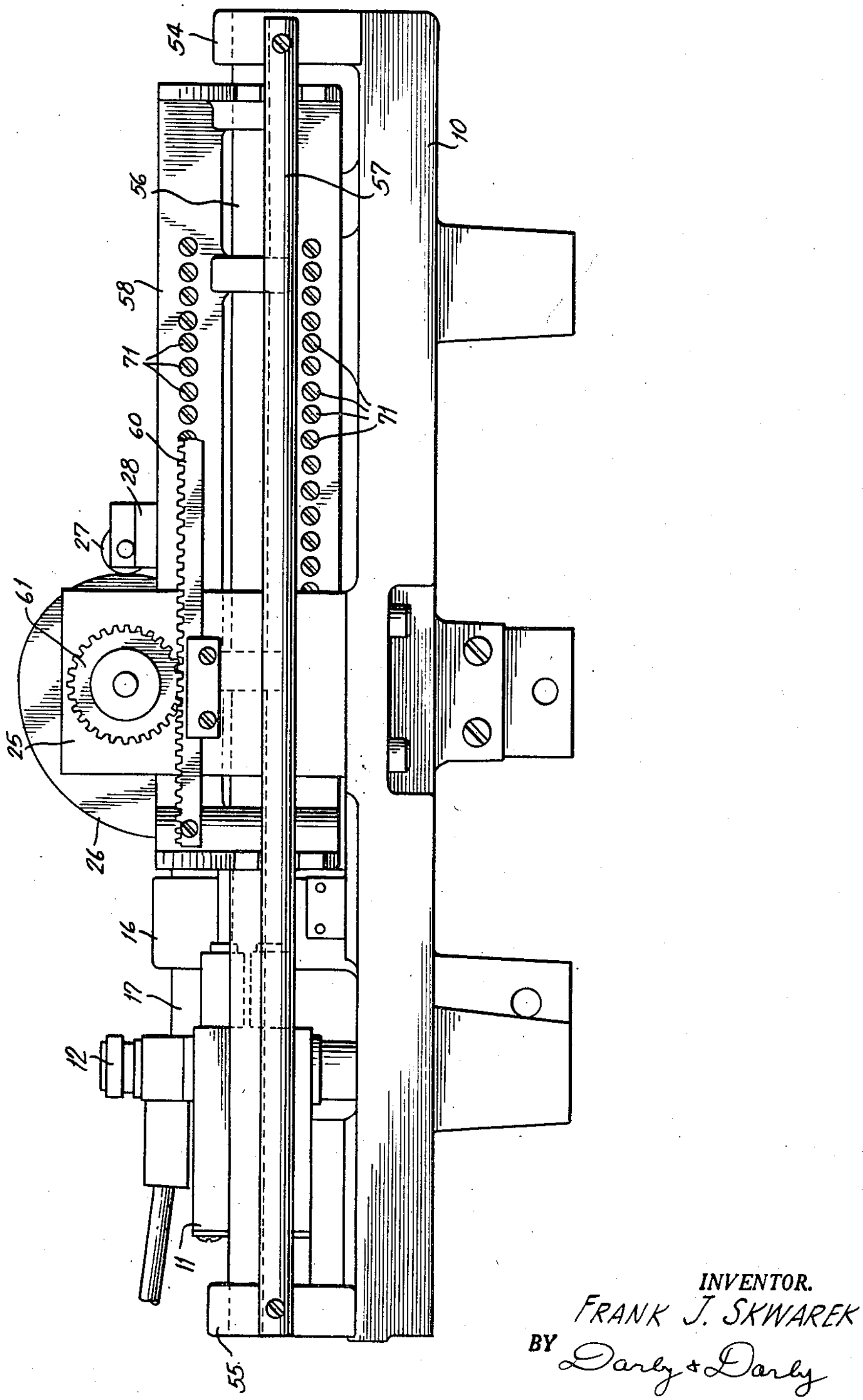
Figure 3 is a rear elevational view of the device of the preceding figures.
Figures 4, 5:
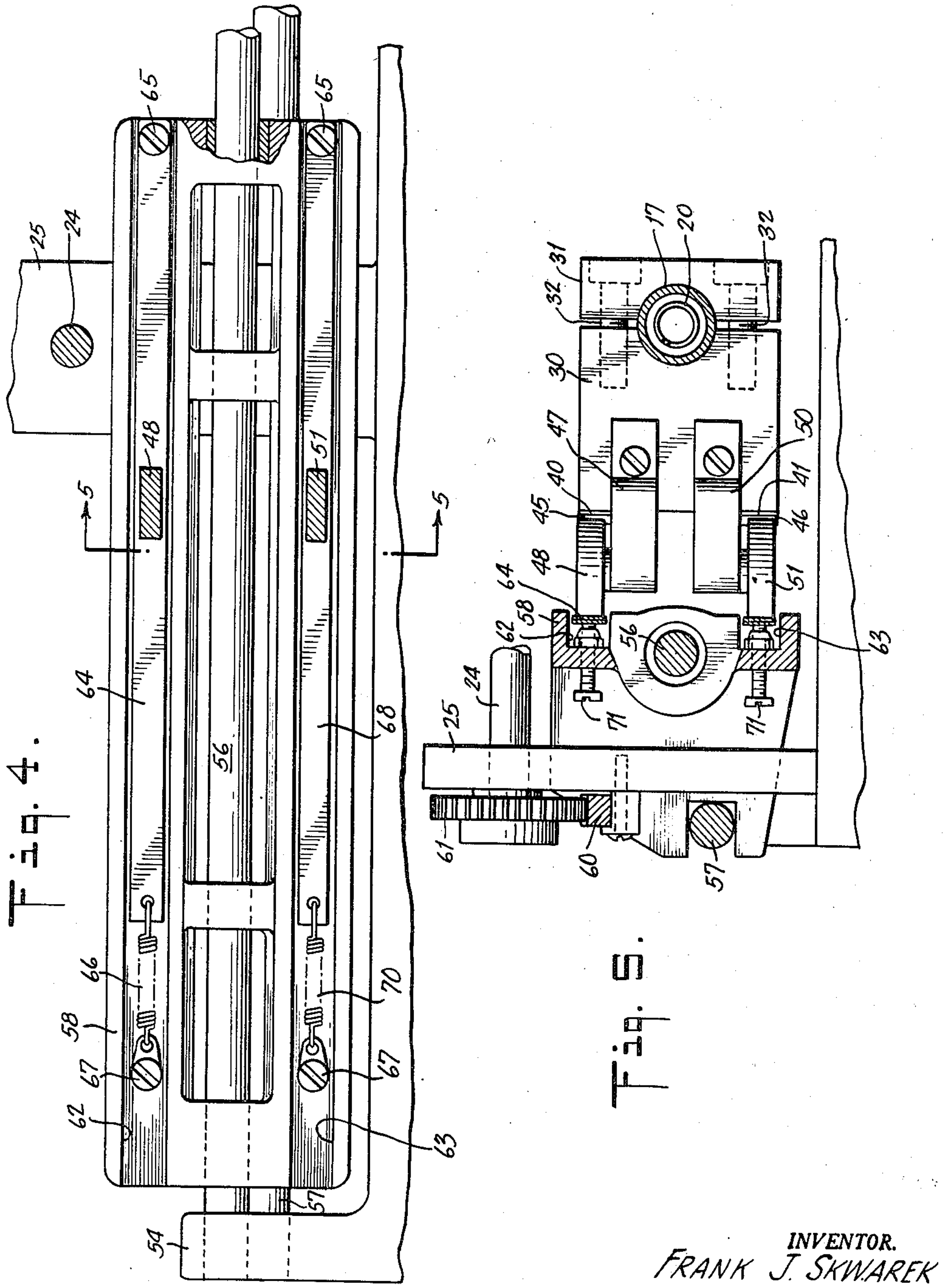
Figure 4 is a longitudinal vertical cross-sectional view, the view being taken on the plane of the line 4—4 of Figure 2.
Figure 5 is a transverse vertical cross-sectional view, the view being taken on the plane of the line 5—5 of Figure 4.

Shaft 24 is supported at its rearmost end in a bracket 25, see Figure 3, and at its forward end in a suitable bearing, not shown. Mounted on shaft 24 is a cam 26. This cam cooperates with a cam roller 27 mounted in a clamp 28 fixed to the rod 17, the cam roller 27 being held against the periphery of the cam 26 by the spring 20. Fixed to the tube 17 is a block 30 which block extends rearwardly and is clamped to the tube 26 by means of the member 31 which is fastened to the block 30 by any suitable means such as the screws 32.

Figure 7:
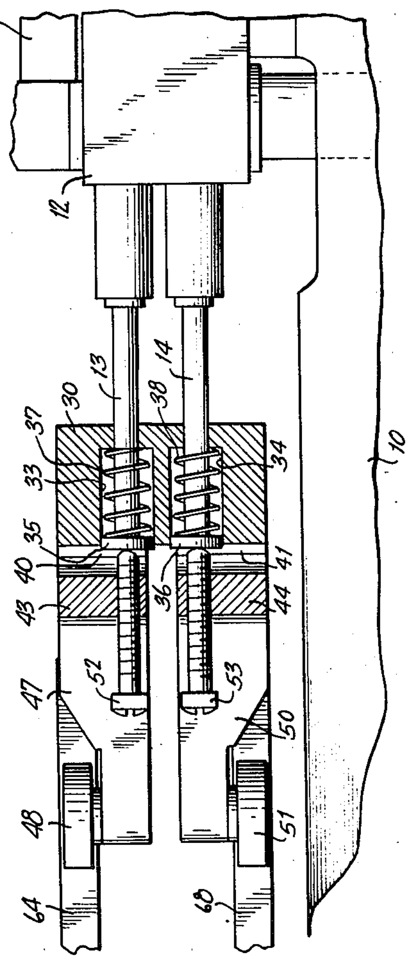
Figure 7 is another vertical longitudinal cross-section, this view being taken on the plane of the line 7—7 of Figure 2.

Referring now to Figure 7, it will be seen that the block 30 is provided with shouldered bores 33 and 34 into which extend the plungers 13 and 14 respectively. Plungers 13 and 14 terminate at their left ends in heads 35 and 36 and springs 37 and 38 respectively bear against the heads 35 and 36 at one end and against the shoulders of bores 33 and 34 at the other end, thus urging the rods or plungers 13 and 14 to the left with respect to the block 30.

Figure 2:
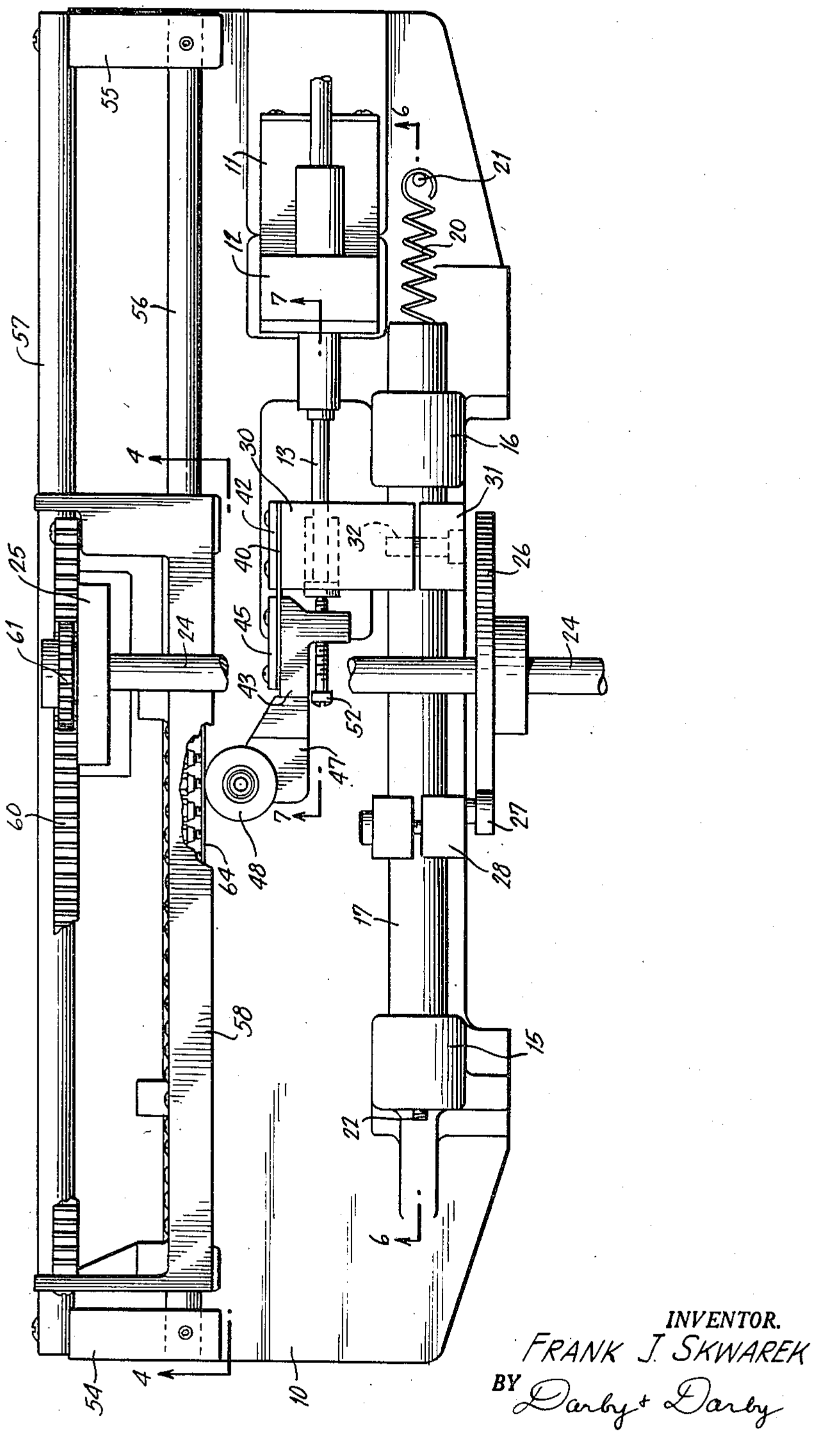
Figure 2 is a top plan view of the device of Figure 1.

Fixed to the rear of the block 30 are two leaf springs 40 and 41, the springs being clamped to the block 30 by means of the clamping plate 42, Figure 2. Springs 40 and 41 extend to the left as seen in Figure 2 and each spring has fastened to it an L-shaped member 43 or 44, the members being fixed to the springs by means of individual clamping plates 45 and 46 respectively.

Fixed to the L-shaped member 44 is a bracket 47 which extends rearwardly and has rotatably mounted thereon a roller 48. In an exactly similar manner the L-shaped member 44 has a bracket 50 fixed thereto on a rearward extension of which there is mounted a roller 51.

In the forward extension of the L-shaped member 43 there is mounted a screw 52 which bears against the head 35 of the plunger 13, and similarly in the member 44 there is mounted a screw 53 which bears against the head 36 of the plunger 14. It will be seen therefore that as the shaft 24 is rotated in a clockwise direction as viewed from the front, the cam 26 permits the cam follower 27 to move toward the right thus causing the block 30 to move toward the right and, since the screws 52 and 53 bear against the heads of rods 13 and 14, causing these rods to likewise move to the right. The above, however, assumes that the leaf springs 40 and 41 are unflexed and provides for no differential in movement as between the two rods or plungers 13 and 14.

In order to provide for such differential movement and to cause the two preselector stages mentioned to be accurately tuned to the desired frequency at all times, additional cam means are provided for correcting and modifying the motion of the rods 13 and 14 individually. These means comprise the rollers 48 and 51, already mentioned, together with cam surfaces which cooperate with these rollers as will be described.

Fixed to the base 10 at the ends thereof and adjacent the rear are two brackets 54 and 55, see Figures 1, 2, 4 and 5. Fixedly mounted in these brackets are the rods 56 and 57. Slidably mounted on the rods 56 and 57 is a cam supporting member 58 which is of generally U-shape, the arms of the U extending rearwardly. Extending between the two arms of the U-shaped member 58 and fixed thereto is a rack 60 with which meshes a gear 61 fixed to the shaft 24. Thus as the shaft is rotated the member 58 slides along the guide rods 56 and 57, the movement being parallel to that of the plungers or rods 13 and 14 governing the dimensions of the resonant cavities of the preselector stages.

Member 58 is provided with two grooves 62 and 63 in the forwardly facing surface thereof. Mounted in the groove 62 is a flexible tape or band 64 which is fixed at one end by means of a pin 65 and is spring urged toward the opposite end by means of a spring 66 extending between the tape end and a similar pin 67. A similar tape 68 is mounted in the lower groove 63 and is stretched between the pins 65 and 67 by means of a spring 70.

Mounted in the rear wall of each of the grooves 62 and 63 are a plurality of screws 71 which screws bear against the respective tapes providing means for causing the tape to take a desired curve when pressed against by the rollers 48 or 51, it being understood that the supports 54 and 55 are so located and the parts so dimensioned that the tapes 64 and 68 when in their stretched position unaffected by the screws 71 bear against the peripheries of the respective rollers 48 and 51, the leaf springs 40 and 41 being then unflexed and screws 52 and 53 permitting plungers 13 and 14 to move to a substantially central point of their range of movement.

Since the member 58 is driven in a direction opposite to the movement of the block 30 when the shaft 24 is rotated the movement of the rollers 48 and 51 along their respective tapes is the sum of the movements of the block 30 and the member 58.

Depending therefore upon the position of the various screws 71 the rollers are urged forwardly or rearwardly thus causing a pivoting action of the respective leaf springs 40 and 41 and modifying the movement of the rods 13 or 14 in accordance with the curvature of the respective tapes 64 or 68 as determined by the screws 71.

It will be noted that were the rack 60 and gear 61 omitted and member 58 fixed in position the movement of the block 30 resulting from the rotation of cam 26 would be so short as to permit of but a small number of adjusting screws which would be insufficient to effect the fine correction to the movement of the preselector tuning rods 13 and 14 which is necessary. However, by causing the member 58 and the tape cams 64 and 68 to move in the opposite direction as the block 30 is moved, it is possible to utilize a large number of tape cam adjustment screws 71, thereby providing the fine correction which is desirable.

While I have described a preferred embodiment of the invention, it will be understood that I wish to be limited not by the foregoing description, but solely by the claims granted to me.

What is claimed is:

1. In a radio receiver having a plurality of preselector stages, each stage having a reciprocable tuning element, in combination, a shaft, a cam mounted on said shaft, a reciprocable cam follower cooperating with said cam, said follower being mounted on a slide and spring-pressed against said cam, a block on said slide, rods connected to the tuning elements mounted in bores in said block, means mounted on said block and bearing against said rods to transmit movement of said block to the tuning elements simultaneously, and means for individually varying the movement of said transmitting means and of said rods.

2. A device as claimed in claim 1, characterized in that said block mounted means for individually varying the movement of said rods comprises a bell crank lever for each rod, one arm of each said bell crank lever bearing against an associated one of said rods, the other arm of each of said bell crank levers carrying a cam follower, and a plurality of cam tracks, one for each of said cam followers, said cam tracks moving with respect to its said individual cam follower as said block moves.

3. A device as claimed in claim 2, characterized in that each said individual cam comprises a tape, said tape being fixed at one end to a support and spring-urged into a stretched condition, and a plurality of screws bearing against the surface of said tape remote from its cam follower, said screws being adjustable to cause the associated tape to assume a curved formation.

4. A device as claimed in claim 1, characterized in that said individual cams are mounted in a reciprocable frame, said frame carrying a rack and further characterized in that a gear is provided on said shaft, said gear meshing with said rack to move said frame and the cams thereon in a direction opposite that in which said block is moved.

5. A device as claimed in claim 1, characterized in that said bell crank levers are individually mounted on said block, said mounting comprising a leaf spring clamped to said bell crank lever and to said block, said spring acting as a pivotal support about which said lever oscillates.

6. A device as claimed in claim 1, characterized in that said block mounted means for individually varying the movement of said rods comprises a bell crank lever for each rod, one arm of each said bell crank lever bearing against an associated one of said rods, the other arm of said bell crank lever carrying a cam follower, and further characterized in that a cam track is provided extending longitudinally adjacent each said cam follower, said rods being spring-urged in a direction to move said cam followers into engagement with their associated cam tracks.

7. A device as claimed in claim 2, characterized in that a cam track supporting member is mounted for reciprocatory movement adjacent said cam followers, said member having a U-shaped formation, said cam tracks comprising tapes fixed directly to one arm of the U and connected by means of a tension spring to the other arm of the U, said tape cam tracks being deformable, and deforming means comprising a plurality of screws threaded through the base of said U in alignment with each of said tapes whereby as the associated cam follower moves along its tape cam track, said cam track is caused to form a curve extending between screws.

8. In a radio receiver having a plurality of pre-selector stages, each stage having a reciprocable tuning element, in combination, a base on which the preselector stages are mounted, brackets mounted on said base, a sleeve mounted in said brackets for reciprocatory movement with respect to said base, resilient means urging said sleeve in one direction, a cam roller mounted on said sleeve, a shaft rotatably mounted on said base, said shaft extending parallel to said base and at right angles to said sleeve, a cam mounted on said shaft in the plane of said cam roller, said cam serving to reciprocate said sleeve as said shaft is rotated, tuning rods extending parallel to said base from the preselector stages, a block mounted on said sleeve for reciprocatory movement therewith, said rods extending into apertures in said block, spring means between heads on said rods and said block urging said rods in a direction opposite to that in which said spring urges said sleeve, a plurality of leaf springs, one for each said tuning rod, said leaf springs being fixed to said block, an angle member fixed to each said leaf spring, one arm of each said angle member bearing against the head of a corresponding tuning rod, a cam roller mounted on the other arm of each said angle, and cam tracks mounted adjacent said cam rollers, said cam tracks being movable with respect to said cam rollers to thereby modify the movement of said block transmitted to each individual tuning rod in accordance with the conformation of its associated cam track.

9. A device as claimed in claim 8, characterized in that said cam tracks comprise tapes stretched between two supports, said supports being longitudinally reciprocable in a direction parallel to the movement of said block, and means for deforming said cam tracks, said means comprising adjustable members bearing against said tracks on the side opposite said cam rollers.

10. A device as claimed in claim 9, characterized in that said supports comprise the arms of a U-shaped member and said deforming means are screws mounted in the base of said U-shaped member and bearing against said tape cam tracks.

11. A device as claimed in claim 10, characterized in that said U-shaped supporting member is mounted for reciprocatory movement, said member having a rack fixed thereto, said rack being driven by a gear mounted on said shaft whereby said block and said U-shaped member move in opposite directions as said shaft is rotated, said tuning rods being individually moved through a distance which is the sum of the movement of said block and of the individual angle member as determined by the movement of the associated tape cam track.

12. In a radio receiver having a plurality of preselector stages, each stage having a tuning device including a reciprocable tuning element, in combination, a drive means, transmission means operated by said drive means for transmitting movement to the tuning elements simultaneously, means interposed between said transmission means and individually tuning elements, means operating said interposed means to individually modify the movement of the tuning elements, common operating means for said modifying means and means driven by said drive means for reciprocating said operating means simultaneouly with said transmission means but in the opposite direction.

13. In a radio receiver having a plurality of preselector stages, each stage having a tuning device including a reciprocable tuning element, in combination, a drive shaft, cam means on said drive shaft, transmission means including a cam follower bearing against said cam for transmitting movement to the tuning elements simultaneously, means interposed between said transmission means and each individual tuning element for individually modifying the movement of the tuning elements, means for operating said interposed means to modify the movement of the tuning elements, and means driven by said drive shaft for reciprocating said operating means in a direction opposite to that of said transmission means.

14. In a radio receiver having a plurality of preselector stages, each stage having a tuning device including a reciprocable tuning element, in combination, a drive shaft, a cam rotatable with said drive shaft, a cam follower engaging said cam, a reciprocating block connected to said cam follower for movement therewith, means connecting said block to the tuning elements, said means including members mounted on said block and connected to the reciprocable tuning elements, cam means mounted adjacent said members for effecting movement of said members individually with respect to said block, and means driven by said drive means for reciprocating said last-mentioned cam means in a direction opposite to the reciprocation of said block to thereby modify the movement of the tuning elements in accordance with the contour of the individual cams associated with said members.

15. A radio receiver in accordance with claim 14, wherein means are provided for limiting the movement of the tuning elements with respect to said block and wherein said individual cam means are flexible and adjustable to operate the associated members to a preselected point within the limited range.

References Cited in the file of this patent

UNITED STATES PATENTS

| | | |
|---|---|---|
| 1,903,156 | Asbury | Mar. 28, 1933 |
| 2,536,409 | Altmann et al. | Jan. 2, 1951 |
| 2,669,699 | Shapiro | Feb. 16, 1954 |